2,948,611

PHOTOPOLYMERIZABLE COMPOSITIONS, ELEMENTS, AND PROCESSES

Arthur Livingston Barney, Wilmington, Del., assignor to E. I. du Pont de Nemours and Company, Wilmington, Del., a corporation of Delaware No Drawing. Filed Oct. 30, 1957, Ser. No. 693,256

7 Claims. (Cl. 96—35)

This invention relates to new polymeric compositions, and more particularly to certain photosensitive, addition polymerizable, ethylenically unsaturated, polymeric compositions. It also relates to photopolymerizable elements, e.g., plates, embodying a layer of such compositions, to processes for making printing reliefs from such elements, and to the resulting printing reliefs.

Solid compositions capable of polymerization under the influence of actinic light to rigid, insoluble, tough structures have recently become of increased technical importance, especially in the making of printing plates, as described and claimed in U.S. Patent 2,760,863. In this process printing plates with uniform printing height are produced directly by: (*a*) exposing to actinic light through an image-bearing process transparency a layer or stratum of non-gaseous addition polymerizable, ethylenically unsaturated composition, containing uniformly dispersed therethrough an addition polymerization initiator activatable by actinic light, and, if desired, a compatible addition or condensation polymer and/or other filler, plasticizer or stabilizer, said layer embodying a suitable adherent support, until substantially complete polymerization of the composition occurs in the exposed areas with substantially no polymerization occurring in the nonexposed areas and (*b*) removing the layer in the latter areas, e.g., by treatment with a suitable solvent in which the substantially fully polymerized composition in the exposed areas is insoluble. Suitable compatible polymers disclosed in said patent include wholly carbon chain addition polymers; polyamides, polyesters and polyesteramides. There is thus obtained a raised relief image corresponding to the transparent image in the transparency suitable for direct use as a printing plate.

An object of this invention is to provide new addition-photopolymerizable compositions and elements. Another object is to provide such compositions and elements which can be used to make improved commercial printing reliefs. Yet another object is to provide such elements which, when used in accordance with the process of Plambeck U.S. Patent 2,760,863 of August 28, 1956, result in tough durable abrasion-resistant printing reliefs. A further object is to provide such elements which result in such printing reliefs which are firm but have somewhat resilient surfaces. A still further object is to provide such compositions which utilize new commercially available polymers. Still other objects will be apparent from the following description of the invention.

The above and other objects are attained in accordance with this invention which in one of its important aspects consists of photopolymerizable compositions comprising (1) polymerization-effective amounts of an addition polymerization initiator activatable by actinic light, (2) a normally non-gaseous ethylenically unsaturated addition polymerizable compound capable of forming a high polymer by photoinitiated addition polymerization in the presence of such an initiator and (3) a chain extended polyalkylene etherglycol polyurethane in an amount up to 90% by weight of the composition. The compositions may, of course, contain other ingredients common in photopolymerizable compositions, e.g., plasticizers, addition polymerization inhibitors or stabilizers, and other compatible filler materials. Components (1), (2) and (3) generally are present in amounts from 0.01% to 10%, from 5 to 60% and 40 to 90%, respectively, by weight of the total composition.

The polyurethane compounds which constitute constituent (3) of the compositions and their preparation are described in detail in assignee's copending application of Hill, Serial No. 365,270, filed June 30, 1953.

Another important aspect of this invention consists of photopolymerizable elements comprising a support and a solid layer of the above photopolymerizable compositions of the invention. The latter compositions can be readily converted into film or layer form in preparing the photopolymerizable elements from solution utilizing conventional mechanical means and methods, e.g., coating, extruding, calendering, or the like, with or without added plasticizers, fillers, etc. The photopolymerizable compositions in film or layer form are surprising in the excellent solid state properties they exhibit, even when containing relatively large proportions of the polymerizable component. Thus, these compositions, even when containing 50–60% by weight of the polymerizable component, still retain their desirable solid properties and most importantly show no noticeable increase in softness or tackiness. After exposure through a process transparency, these new compositions are readily developable to printing reliefs with suitable solvents.

The printing reliefs obtained from these compositions are outstanding because of the especially good wear resistance which they exhibit. Quite surprisingly, these printing reliefs, although prepared from a rubbery or elastomeric product, are rigid in the relief heights and print with excellent fidelity and substantially perfect register. The wear characteristics of the resulting plates are good and they form economical substitutes for the previously known premium quality plates, e.g., the difficult to prepare and expensive nickel-faced electrotypes. The printing plates are important commercially because of the extremely long press runs which can be carried out therewith.

The photopolymerizable elements of the invention suitable for the preparation of printing relief images comprise a layer of the photopolymerizable composition from about 3 to about 250 mils in thickness and embody a suitable adherent support. In a preferred embodiment, these elements will comprise supports from which no more than 35% of the incident actinic light is reflected. When the support material is light reflective, e.g., metal plates or foils, which are outstanding because of inherent superior physical properties, there will be superposed on said support and adherent thereto a layor absorptive of actinic light so as to permit reflectance from the combined support of no more than 35% of the incident actinic light. Thus, the support can contain an antihalation material or have a layer or stratum of such material on its surface. The photopolymerizable layer itself can serve as the light-absorptive layer when dyes or pigments or other materials significantly absorptive of the actinic light are included in the photopolymerizable composition. Similarly, the adherent support for the relief height-forming photopolymerizable stratum can be a supporting sheet of the photopolymerizable composition itself. These photopolymerizable elements can be made in the various manners given in Plambeck U.S. Patents 2,760,863 and 2,791,804.

The various components of the new compositions of this invention must be carefully selected. The solid polyetherurethane is one obtained from: a polyalkylene ether glycol having a molecular weight of at least 400–500, and preferably at least 750; an organic diisocyanate; and a chain extending compound or mixture of compounds containing active hydrogen atoms. This latter compound, or compounds, can be water or hydrogen sulfide, or can be and preferably is, or are, an organic compound or compounds containing active hydrogen atoms attached to two different atoms in the molecule.

The polyalkylene ether glycols are polyalkylene oxyethers containing terminal hydroxy groups, such as ordinarily are derived from the polymerization of cyclic ethers, e.g., alkylene oxides or dioxolanes, or from the condensation of glycols. The method of preparation is immaterial. These glycols are representable by the formula $HO(RO)_nH$, in which R stands for an alkylene radical and $n$ is an integer greater than one. The alkylene radicals need not all be the same in any one glycol, e.g., polyglycols formed by the copolymerization of a mixture of different alkylene oxides or glycols can be used—see, for instance, U.S. Patent 2,492,955. The polyalkylene ether glycols must have a molecular weight of at least 400–500 and preferably at least 750 and for use in the present compositions will generally have a molecular weight not greater than 2000 and preferably not greater than 3500. These figures represent number average molecular weight values and are conveniently obtained from the hydroxyl numbers of the polyglycols. The preferred polyalkylene ether glycol is polytetramethylene ether glycol. Suitable others are polyethylene ether glycol, polypropylene ether glycol, 1,2-polydimethylethylene ether glycol, polydecamethylene ether glycol, and the like.

Any of a variety of organic diisocyanates can be employed in preparing these polyether-polyurethanes, including aromatic, aliphatic, and cycloaliphatic diisocyanates and combinations thereof. Representative specific compounds include 2,4-tolylene diisocyanate, m-phenylene diisocyanate, 4-chloro-1,3-phenylene diisocyanate, 4,4′-biphenylene diisocyanate, 1,4-tetramethylene and 1,6-hexamethylene diisocyanate, 1,4-cyclohexylene diisocyanate, 1,5-tetrahydronaphthalene diisocyanate, and the like. Arylene diisocyanates in which each of the two isocyanate groups is directly attached to an aromatic ring are preferred, since, generally, they react more rapidly with the polyalkylene ether glycols. The diisocyanates can contain other substituents, although those which are free from reactive groups other than the necessary two isocyanate groups are preferred.

The chain-extending agent which is used in the preparation of the compounds used in accordance with this invention as component (3) is a compound containing a plurality of active hydrogen atoms capable of reacting with isocyanate groups. No more than two atoms in the molecule of each chain-extending agent have active hydrogen attached thereto. Water and hydrogen sulfide can be used. Organic compounds containing two and only two atoms to which are attached active hydrogen atoms can likewise be used and are preferred in the present invention. The active hydrogen atoms referred to are those which display activity according to the Zerewitinoff test as described by Kohler, J. Am. Chem. Soc. 49, 3181 (1927).

In the chain extender compounds useful in preparing these chain extended polyalkylene ether glycol urethanes, the active hydrogen atoms are attached to oxygen, nitrogen, or sulfur, i.e., the groups containing the active hydrogen are hydroxyl, mercapto, imino, amino, carboxyl, carbamoyl, substituted carbamoyl, sulfo, sulfonamido, thiocarbamoyl, substituted thiocarbamoyl, and the like. The chain-extending compound can otherwise be aliphatic, aromatic, or cycloaliphatic, or of mixed types. Typical of many specific chain-extending compounds useful in this connection are glycols, e.g., ethylene, hexamethylene, diethylene glycols; dicarboxylic acids, e.g., adipic, terephthalic acids; carboxamides, e.g., adipamide; mercapto-containing compounds, e.g., 1,2-ethanedithiol; amino and mixed amino-containing compounds, e.g., monoethanolamine, 4-aminobenzoic acid, m-phenylenediamine, propylenediamine, aminopropionic acid; sulfonamide-containing compounds, e.g., 1,4-cyclohexanedisulfonamide, 1,3-propanedisulfonamide; diamines, e.g., ethylenediamine and 2,4-tolylenediamine. The preferred chain-extending compounds are those in which at least one of the active hydrogens is hydrogen on amino nitrogen. The more preferred chain-extending compounds are those which are organic as distinct from the inorganic chain-extending agents, since the former are generally more soluble in the polyalkylene glycol ether/diisocyanate prepolymer. Furthermore, when water, carboxylic acids, or sulfonic acids are used as chain-extending compounds, gaseous products are evolved during the chain-extending reaction which must be removed unless a porous product is desired. For use in forming the photopolymerizable compositions of the present invention these are generally not desired.

The extended polyurethane component can be prepared in any one of several different procedures. Thus, the diisocyanate, or mixtures thereof, is mixed with the polyalkylene ether glycol or, again, mixtures thereof, in suitable mixing equipment, e.g., a Werner-Pfleiderer mixer at a temperature which is preferably from 70 to 120° C. but which can range from room temperature to as high as 150° C. After one half to three hours' mixing, or whenever there is no further change in the viscosity of the reaction mass, the desired amount of the chain-extending agent is added and mixing is continued. When the mass forms tough, rubbery clumps or crumbs, or begins to pull away from the mixer, it can be removed therefrom and worked on a rubber mill to form a smooth band.

The products of particular significance for use in the photopolymerizable compositions of this invention are those wherein substantially all the isocyanate groups have been reacted, i.e., where on a molar basis the sum total of available hydroxyl units from the polyalkylene ether glycol and the available active hydrogen units from the chain-extending reactant will substantially equal the number of available isocyanate groups in the diisocyanate component. Such products are substantially linear polymers and are somewhat elastic, homogeneous solids. These linear polymers, as previously indicated, are polyalkylenether-polyurethane polymers which are essentially comprised of recurring structural units having the formula:

$$-\left[HN-\left(B-NH-\overset{\displaystyle O}{\overset{\|}{C}}-O-G-O-\overset{\displaystyle O}{\overset{\|}{C}}-NH\right)_n-B-NH-\left(Q-HN-B-NH\right)_m\right]-$$

where —O—G—O— is a bivalent radical resulting from removal of terminal hydrogen atoms from a polyalkylene ether glycol; —B— is a bivalent organic radical; —Q— is a radical selected from the group consisting of a carbonyl radical and a non-polymeric diacyl radical; $n$ is an integer greater than 0; e.g., 1 to 5 or more, and $m$ is an integer including 0, e.g., 0 to 5, each of the said structural units being connected to the next by a radical —Q— having the significance defined above; the overall ratio of the number of —B— to —O—G—O— radicals in the polymer being between 1.1:1 and 12:1 and at least 60% of the total weight of the polymer being the bivalent radicals —O—G—O—.

While the broad aspects of the above-identified Hill application concerning these extended polyurethanes and their preparation are inclusive of other types in which there are unreacted isocyanate units and/or which may comprise other added polycomponent isocyanate reactants and/or curing agents which are destined for ultimate cure to a vulcanized condition, the extended polyurethanes most useful here are the substantially linear products just described.

Phrased differently the most useful extended polyurethanes for the present photopolymerizable compositions are those prepared from a polyalkylene ether glycol and a molar excess of a diisocyanate with sufficient added chain extending agent to just take care of the excess isocyanate units present. Numerically, this may be regarded in terms such that on a molar basis the total number of available isocyanate groups versus the total number of available hydroxyl groups from the ether glycol and the active hydrogen units from the extending agents are in a ratio of substantially 1:1. A preferred class of these extended polyurethanes are those ranging in molecular weight from 5,000–10,000 to about 100,000, and especially those ranging in molecular weight from 10,000–20,000 to 50,000. Furthermore, the most desirable are those wherein the chain units achieved through the reaction of the chain-extending agent are greatly in the minority. The molar ratio of the polyalkylene ether glycol to the chain-extending agent should be such that the polyether residues from the polyalkylene ether glycol comprise from 60 to 95% of the weight of the total product.

Instead of first reacting the polyalkylene ether glycol with the diisocyanate to form what may be referred to as a prepolymer and subsequently reacting this with the chain-extending agent as described above, all of the ingredients can be added simultaneously or the diisocyanate can be added to a mixture of the glycol and the chain extending agent. Alternatively the chain extender can first be reacted with the diisocyanate and this reaction product subsequently mixed with the polyalkylene ether glycol. Obviously in all forms of the reaction, mixtures as well as single components of the diisocyanate, the polyalkylene ether glycol, or the chain extender can all be used.

In an alternative procedure, the reaction can be carried out in a solvent. One type of solvent is that in which the final elastomeric reaction product is insoluble, in which manner of proceeding the extended polyurethane is thereby isolated and further compounded to form the photopolymerizable compositions of the invention. Suitable solvents include aliphatic hydrocarbons, such as heptane and octane. When the reaction is carried out in such solvents, the polyalkylene ether glycol can first be dissolved and any water that is present can be azeotropically removed from the solution. The organic diisocyanate is then added, and after completion of the reaction between these components the chain extender component is added. After continued stirring and heating, the elastomeric product separates out and can be worked on a heated rubber mill to remove solvent if desired. Certain other types of solvents permit the reaction to proceed entirely in solution, with the final extended polyurethane remaining in solution. Such procedures, therefore, permit compounding in solution of the extended polyurethane with the photoinitiator and low molecular weight, addition polymerizable component along with any other desired stabilizers, plasticizers, fillers, and the like to form the photopolymerizable compositions of the present invention. Solvents permitting this type operation include those containing oxygen or nitrogen, e.g., dimethylformamide, tetrahydrofuran and dioxane. When desired, the polyurethane may be prepared in the solid state as described previously and then dissolved in the preferred solvent.

The addition polymerizable component (2) of the new compositions of this invention should be carefully selected and can comprise one or more such compounds, preferably containing a plurality of addition polymerizable, ethylenic linkages. This component must be present in only carefully selected concentrations ranging from 5 to 10%–60%, and preferably from 20% to about 40% by weight of the whole composition. The extended polyurethane component can likewise contain addition polymerizable, ethylenic groups. Thus, in Pattison U.S. Patent 2,808,391 suitable such components are disclosed.

Not only is the concentration of this component (3) critical, but so is the chemical and physical nature thereof. In the first place, the polymerizable component must be compatible with and preferably show some plasticizing action for the extended polyalkylene ether glycol polyurethane. In general, the overall composition, including the necessary added photoinitiator, should preferably exhibit an optical density to the actinic light of less than 0.5 per mil and less than 5.0 in the relief height-forming stratum or strata thereof of photopolymerizable elements for making printing reliefs.

The addition polymerizable component should have a normal boiling point greater than 100° C. at atmospheric pressure. It can vary in molecular weight from about 100 to about 1500 but must contain at least one addition polymerizable ethylenic linkage for every about 300 units of molecular weight. The preferred addition polymerizable components are those of molecular weight 150 to about 500 containing at least one addition polymerizable ethylenic linkage for every 100–250 units of molecular weight.

The photoinitiator component, i.e., addition polymerization initiator activatable by actinic light, should be chosen carefully, both as to identity and concentration. It must be soluble in the overall composition or capable of substantially uniform distribution therethrough. Many such compounds are known and they can be used singly or admixed in the present compositions. The photoinitiators are generally present in the compositions in amounts ranging from about 0.01% up to about 10.0% with preferred quantities lying in the range of 0.1–2.0% based on the total composition.

This invention is illustrated in greater detail by the following examples in which the parts given are by weight.

*Example I*

A polytetramethylene ether, i.e., oxide, glycol/2,4-toluene or -tolylene diisocyanate/ethylenediamine polyether polyurethane polyurea was prepared by reacting a polytetramethylene ether glycol of molecular weight 1000 with sufficient excess 1,4-tolylene diisocyanate in tetrahydrofuran solution to form a polytetramethylene ether polyurethane containing 2.26% by weight unreacted, i.e., free, isocyanate groups. A tetrahydrofuran solution containing sufficient ethylenediamine to react with the free isocyanate groups was then added, and the polyether polyurethane polyurea resulting therefrom was used directly in solution in the tetrahydrofuran solvent. Twenty parts of this solution containing about 10% by weight (i.e., about 2 parts) of the polyether polyurethane polyurea was mixed with one part of triethylene glycol dimethacrylate containing about 50 p.p.m. hydroquinone stabilizer and 0.02 part of benzoin methyl ether initiator. The resultant, clear solution was cast in the dark on a glass plate, and the solvent allowed to evaporate at room temperature in the dark. There was thus obtained a clear, firm, non-tacky, elastic sheet of the polyether polyurethane polyurea/triethylene glycol dimethacrylate/hydroquinone/benzoin methyl ether composition about 15 mils thick firmly adherent to the glass plate.

The sheet and accompanying glass plate support were exposed for 5 minutes through a line process negative to the radiation from a 275-watt sunlamp at a distance of 8 inches. The negative and photopolymerizable layer, with the attendant glass support, were maintained in direct contact during exposure in a vacuum printing frame with an antihalation backing. At the end of the exposure the negative was removed and the photopolymerizable composition in the unexposed, and thus, unchanged areas of the photopolymerizable layer under the dark areas of the transparency was removed by washing in tetrahydrofuran for a few minutes. There was thus obtained a clear, firm, resilient, raised relief image of the letter text in the clear areas of the transparency, exhibiting good legibility, fidelity of image, good recess areas, and relatively sharp edges of the relief printing height.

*Example II*

A photopolymerizable elastic sheet was prepared as in Example I from a mixture of two parts of the same polyether polyurethane polyurea, one part of triethylene glycol diacrylate containing about 50 p.p.m. hydroquinone, and 0.01 part anthraquinone. Exposure for 5 minutes and development with tetrahydrofuran as in Example I gave a similar clear, legible, firm, resilient, raised relief image of the letter text in the transparency.

Another elastic photopolymerizable sheet similarly prepared from 3 parts of the polyether polyurethane polyurea, 1 part of triethylene glycol diacrylate containing about 50 p.p.m. hydroquinone, 0.01 part of anthraquinone, and a trace of additional hydroquinone, when similarly exposed and developed, gave a similar, slightly softer relief image with equivalent legibility and edge sharpness but somewhat slower developability.

*Example III*

A photopolymerizable elastic sheet was prepared in the manner of Example I from 2 parts of the same polyether polyurethane polyurea, 1 part of tetramethylene diacrylate, 0.01 part of anthraquinone initiator, and a trace of hydroquinone stabilizer. Upon exposure and development as in Example I, there was obtained an equivalent, clear, legible, relief image of the letter text in the transparency, exhibiting good edge sharpness of the relief.

Suitable chain extended polyalkylene ether glycol diisocyanate polyurethanes which can be used in preparing the new photopolymerizable compositions of the present invention by substitution in the foregoing more detailed descriptions include a polytetramethylene ether glycol/2,4-tolylene diisocyanate reaction product chain extended with water, a polytetramethylene ether glycol/2,4-tolylene diisocyanate reaction product chain extended with m-tolylenediamine, a polytetramethylene ether glycol/2,4-tolylene diisocyanate reaction product chain extended with ethylene glycol, a polyethylene ether glycol/m-phenylene diisocyanate reaction product chain extended with ethylenediamine, a polypropylene ether glycol/methylene di-p-phenylene diisocyanate reaction product chain extended with hexamethylenediamine, a polyethyleneoxymethyleneoxy ether glycol/1,5-naphthylene diisocyanate reaction product chain extended with hexamethylene glycol, a polytetramethylene ether glycol/p-phenylene diisocyanate reaction product chain extended with 1,3-propylene glycol, a polytetramethylene ether glycol/methylene-di-4-cyclohexylene diisocyanate reaction product chain extended with ethylenediamine, a polytetramethylene ether glycol/2,4-tolylene diisocyanate reaction product chain extended with succinic acid, a polytetramethylene ether glycol/2,4-tolylene diisocyanate reaction product chain extended with adipic acid or terephthalic acid, 1,3-propanedisulfonamide, or thiodipropionic acid, and the like, with or without added water, a polyethylene ether glycol/methylene di-p-phenylene diisocyanate reaction product chain extended with 2,4-tolylenediamine and the like.

Like the above-described chain extended polyalkylene ether glycol polyurethane component, the low molecular weight, addition polymerizable component of the new compositions of this invention is important both as to its nature and as to the quantity present in the new compositions. Thus there must be at least 5–10% by weight of this addition polymerizable component, which preferably has a plurality of addition polymerizable ethylene linkages. Compositions containing smaller quantities either insolubilize too slowly on light exposure or else do not insolubilize sufficiently to permit adequate and proper development of the printing relief image. On the other hand, compositions containing more than about 60% by weight of the composition of this low molecular weight, addition polymerizable component are likewise unsatisfactory in that at these higher levels the low molecular weight, unsaturated, addition polymerizable component is either incompatible with the extended polyurethane component, or else, if compatible, due to the concomitant solubilizing or plasticizing action on the polymer component, the resulting compositions are soft and tacky and more difficult to use in the preparation of relief printing plates. Because of the more rapid insolubilization in shorter exposure times, it is desirable to include in the new compositions of this invention as much of this low molecular weight, addition polymerizable component as is possible consonant with the achievement of the firm, non-tacky, solid layers desired for use in preparation of relief printing plates. In general, this addition polymerizable component will preferably be present in amounts of from 20–40% based on the composition as a whole.

The low molecular weight addition polymerizable component (2) must have a minimum boiling point of 100° C. at atmospheric pressure and must form with the extended polyurethane component a substantially homogeneous and non-light-scattering composition. Furthermore, component (2) must be compatible with the extended polyurethane component and the photoinitiator and desirably exhibits plasticizing or solvent action for either or both, especially the former, particularly at elevated temperatures. Generally speaking, this component (2) will range from 100 to no greater than about 1500 in molecular weight since materials within this range exhibit the best plasticizing or solubilizing action for the polymer component and on exposure polymerize more rapidly to somewhat more insoluble polymers. Desirably, this addition polymerizable component (2) should have at least one terminal vinylidene group per molecule.

Suitable specific such components include selected esters of α-methylene carboxylic acids, e.g., methyl methacrylate, diethylene glycol monoacrylate, N-(β-hydroxyethyl)-methacrylamide, N,N-bis(β-hydroxyethyl)-acrylamide, β-acetamidoethylmethacrylate and β-methacrylamidoethyl propionate; selected olefin blends with ethylenic α,β-dicarboxylic acid or esters thereof, e.g., styrene/diethyl fumarate, styrene/diethyl maleate blends; esters of vinylbenzoic acid, e.g., methyl vinylbenzoate, β-hydroxyethyl vinylbenzoate, and the like. Preferred such polymerizable components are the esters, esteramides, and the amides.

Because of their generally more rapid rate of insolubilization on exposure, presumably due to a relatively rapid establishment of a network polymer structure, an outstanding class of the low molecular weight addition polymerization components are those having a plurality of addition polymerizable ethylenic linkages, particularly when present as terminal linkages, and especially those wherein at least one and preferably most of such linkages are conjugated with a doubly bonded carbon including carbon doubly bonded to carbon and to such heteroatoms as nitrogen, oxygen, and sulfur. Particularly useful are such materials wherein the ethylenically unsaturated groups, especially the vinylidene groups, are conjugated with ester or amide structures. The following specific compounds are further illustrative of this class: unsaturated esters of polyols, particularly such esters of the a-methylene carboxylic acids, e.g., ethylene diacrylate, diethylene glycol diacrylate, glycerol diacrylate, glycerol triacrylate, ethylene dimethacrylate, 1,3-propylene dimethacrylate, 1, 2,4-butane triol trimethacrylate, 1,4-cyclohexanediol diacrylate, 1,4-benzenediol dimethacrylate, pentaerythritol tetramethacrylate, 1,3-propanediol diacrylate, 1,5-pentanediol dimethacrylate, the bis-acrylates and methacrylates of polyethylene glycols of molecular weight 200–500; unsaturated amides, particularly those of the α-methylene carboxylic acids, and especially those of α,ω-diamines, such as methylene bis-acrylamide, methylene bis-methacrylamide, ethylene bis-methacrylamide, 1,6-hexamethylene bis-acrylamide, diethylene triamine tris-methacrylamide, bis(γ-methacrylamidopropoxy)-ethane, β-methacrylamidoethyl methacrylate, N-(β-hydroxyethyl)-β-(methacrylamido) ethyl acrylate, and N,N-bis(β-methacrylyloxyethyl) acrylamide; vinyl esters, e.g., divinyl terephthalate, divinyl benzene-1,3-disulfonate and divinyl butane-1,4-disulfonate; unsaturated aldehydes, e.g., a-vinyl crotonaldehyde.

An outstanding class of these preferred addition polymerizable components are the esters and amides of α-methylene carboxylic acids and substituted carboxylic acids with polyols and polyamines wherein the molecular chain between the hydroxyls and amino groups is solely carbon or oxygen-interrupted carbon. The most outstanding of the low molecular weight polymerizable components, for reasons of superior compatibility, are the polymerizable components with moderately polar substituents, for instance, the polymerizable amides, esters, esteramides, or those with hydroxy-substituents, or those immediately described above with oxy-interrupted carbon chains, and especially the esters.

As pointed out in the above, the chain extended polyalkyleneether glycol polyurethane component (3) and the low molecular weight addition polymerizable component (2) of these new compositions should be very carefully selected. The same is true for the necessary addition polymerization initiator. In the first place, the photoinitiator, i.e., addition polymerization catalyst activatable by actinic light, must be compatible with both the other two necessary components, as well as any other added organic or inorganic fillers or the like, and is preferably soluble in the low molecular weight polymerizable component. In any event, it must be capable of being substantially completely homogeneously distributed throughout the new compositions. In the second place, since most conventional light sources give off both heat and light and since the former is transmitted equally well by both the opaque and transparent areas of the image-bearing process transparencies used in the process, the free radical generating, addition polymerization initiators should not be activatable thermally below about 85° C. This is also important since the polymerization itself generates heat, some of which is transmitted to areas of the compositions outside the exposed areas. In order to preserve ultimate fidelity of the printing image, such transmitted heat should not be permitted to initiate polymerization in the unexposed areas. Precautions can be taken to exclude to some extent the heat rays emanating from the light source and to remove heat buildup caused by polymerization, so as to maintain the photopolymerizable layer at temperatures which are not effective in activating the intiator thermally, but these are obviously troublesome. Furthermore, complete exclusion of input or generated heat makes necessary longer exposure times since the rate of chain propagation in the polymerization reaction is lower at reduced temperatures.

Thus, the free radical generating addition polymerization initiators useful in these new compositions are those capable of initiating polymerization under the influence of actinic light which are dispersible in the aforesaid described chain extended polyurethane component/lower molecular weight polymerizable component compositions to the extent necessary for initiating the desired polymerization under the influence of the light energy available and which are not active thermally at temperatures below 80–85° C. Desirably no other type of initiator is present except for the normally unavoidable, adventitious trace quantities of peroxides. The preferred initiators are obviously those which are most rapidly affected by the light energy available in the shortest exposure times to initiate the greatest number of growing polymer chains. These photopolymerization initiators are used in amounts of from 0.01–10.0%, and preferably from 0.1–2.0%, based on the weight of the entire composition. Suitable such initiators include vicinal ketaldonyl compounds, e.g., diacetyl, benzil, etc.; a-ketaldonyl alcohols, e.g., benzoin, pivaloin, etc.; acyloin ethers, e.g., benzoin methyl or ethyl ethers, etc.; α-hydrocarbon-substituted aromatic acyloins, including α-methylbenzoin, α-allylbenzoin (U.S. 2,722,512), and α-phenylbenzoin; the polynuclear quinones, such as anthraquinone, naphthoquinone, etc.; the O-alkyl xanthate esters (U.S. 2,716,633); and the like. The acyloin ethers are particularly useful.

Most of the low molecular weight polymerizable components discussed previously, including both the mono- and polyethylenically unsaturated componds, will normally contain, as obtained commercially, minor amounts (about 50–100 parts per million by weight) of polymerization inhibitors so as to prevent spontaneous polymerization before desired. The presence of these inhibitors, which are usually of the antioxidant type, e.g., hydroquinone, tertiary butyl catechols, and the like, in such amounts causes no undesirable results in the photopolymerizable layers of this invention either as to speed or quality of polymerization. In fact, larger quantities of such inhibitors, e.g., of the order of 200–500 p.p.m., can easily be tolerated and may be advantageous in tending to reduce unwanted polymerization in non-exposed, i.e., non-image, areas.

Suitable specific examples of the new compositions of this invention, in addition to those given in the foregoing detailed discussion, containing: a chain-extended polyalkylene ether glycol polyurethane; a compatible, low molecular weight, addition polymerizable component; and a photoinitiator include: a 70.0/29.5/0.5 polytetramethyleneether glycol (2000)-methylenedi-p-phenylene diisocyanate polyurethane chain extended with ethylene glycol/diethylene glycol dimethacrylate/benzoin composition; an 89.8/10.0/0.2 polypropyleneether glycol (1000)-4,4'biphenylene diisocyanate polyurethane chain extended with ethylenediamine/N-(β-methacryloyloxyethyl)methacrylamide/2-tert.-butylanthraquinone compositon; a 60.0/39.0/1.0 polyethyleneether glycol (1500)-2,4-tolylene diisocyanate polyurethane chain extended with ethanolamine/tetramethylene glycol diacrylate/benzoin methyl ether composition; a 75.0/24.5/0.5 polyethyleneether glycol (1000)-tetramethylene diisocyanate polyether polyurethane chain extended with hexamethylenediamine/triethylene glycol dimethacrylate/pivaloin composition; a 79.0/20.5/0.5 polytetramethyleneether glycol (1000)-m-phenylene diisocyanate polyurethane chain extended with m-phenylenediamine/methylenebisacrylamide/2-chloroanthraquinone composition; a 65.0/34.8/0.2 polyethyleneether glycol (2000)-2,2-propylene-di-p-phenylene diisocyanate polyurethane chain extended with diethylene glycol/hexamethylene glycol dimethylacrylate/benzoin methyl ether composition; a 65.0/34.9/0.1 polytetramethyleneether glycol (1000)-1,4-cyclohexenylene diisocyanate polyurethane chain extended with 1,2-ethanedithiol/triethylene glycol diacrylate/benzoin composition; a 70.00/29.95/0.05 polytetramethyleneether glycol (1000)-m-phenylene diisocyanate polyurethane chain extended with adipamide/tetraethylene glycol dimethacrylate/anthraquinone compositon; a 79.0/20.8/0.2 polyethyleneether glycol (1000)-2,4-tolylene diisocyanate polyurethane chain extended with triethylene glycol/glyceryl triacrylate/2-chloroanthraquinone composition; a 60.0/39.7/0.3 polypropyleneether glycol (500)-methylenedi-p-phenylene diisocyanate polyurethane chain extended with 1,3-propylenediamine/bis(γ-methacrylamidopropoxy)ethane/α-allylbenzoin composition and a 40.0/59.8/0.2 polyethyleneether glycol (1000)-methylenedi-p-phenylene diisocyanate polyurethane chain extended with hexamethylenediamine/glyceryl triacrylate/benzoin methyl ether composition.

Because of the readier availability thereof and the overall desirable properties exhibited thereby as to ease of handling, compatibility, photographic speed and wear resistance, the preferred compositions are those wherein the chain extended polyalkyleneether plycol polyurethane component is one prepared from: (1) a polyalkylene ether glycol which exhibits a carbon/ether-oxygen atom ratio no greater than 10/1, and most preferably no greater than 6/1, and which is solely hydrocarbon except for ether and hydroxy groups; (2) a diisocyanate of no more than 20 carbons which is solely hydrocarbon except for the two isocyanate groups; and (3) a chain extender component of no more than 10 carbons which is solely hydrocarbon except for two Zerewitinoff active hydrogen-containing groups as aforesaid defined.

In addition to the aforesaid components or mixtures thereof, the photopolymerizable layer can also contain added preformed compatible condensation or addition polymers as well as immiscible polymeric or nonpolymeric, organic or inorganic fillers or reinforcing agents which are essentially transparent, e.g., organophilic silicas, bentonites, silica, and powdered glass having a particle size less than 0.4 mil in their maximum dimension, and in amounts varying with the desired properties of the photopolymerizable layer.

Suitable preformed compatible polymers include the addition polymers generally, such as the polyvinyl acetals, e.g., polyvinyl butyral, formal and hydrolyzed derivatives thereof; and the like. Suitable compatible condensation polymers include both saturated and unsaturated types, such as the alkyd polymers, e.g. polyglycerol phthalate, polyglycerol maleate, and the like. Suitable modified natural polymers include the cellulose esters and ethers, e.g., cellulose acetate butyrate and ethyl cellulose. Other useful polymeric fillers include: the polymeric glycols and glycol ethers, e.g., the polyethylene glycol ethers; the polyethylene oxides, especially the (1000–5000) molecular weight species. The foregoing polymers will generally be used in only relatively minor amounts.

These added substituents can be present in all the foregoing compositions in order to modify their rheological properites, render the photopolymerizable layers even more tack-free where desired, and make the compositions more readily formable into sheets. Since a stiff sheet can be more easily handled in many forming operations, e.g., in preparing a photopolymerizable plate for use in making a printing plate, the use of filler materials such as the foregoing giving the requisite stiffness has commercial advantages. Mixtures of two, three, or more of the foregoing compatible polymers and/or fillers can be used in the photopolymerizable compositions, but in general the fillers should not be present in amounts exceeding about 40% by weight of the whole composition. With polymeric fillers amounts up to about 20% by weight of the whole give the best results.

Inert, relatively non-volatile, liquid or semi-liquid plasticizers can be present and are efficacious when the compositions per se are too stiff, or when relatively low amounts of the low molecular weight polymerizable component, e.g., 10–15% by weight of the whole are present. Suitable plasticizers are the polyketones of assignee's Verbanc application Serial No. 533,019, filed September 7, 1955.

It has been pointed out above that the addition polymerizable component should be compatible with the chain extended polyurethane component. As is established in the polymer art, the term "compatibility" is used to describe the ability of two or more constituents to remain homogeneously dispersed together. In the photopolymerizable elements of this invention, some slight haze of layers coated or extruded from such compositions, before or during exposure, can be tolerated in the preparation of printing reliefs therefrom, but when fine detail is desired, haze preferably is avoided. The photopolymerizable compositions of this invention are essentially non-light scattering of the actinic light when in the form of thin layers for use in the photopolymerizable elements of this invention, e.g., layers from 3 to 250 mils thick. Of course, the initiator component absorbs sufficient light energy to initiate the polymerization.

The photopolymerizable elements of this invention can be made by casting or milling or extruding a solution, dispersion, or mix of the photopolymerizable composition, depending on the specific physical properties thereof, into the form of a layer on a suitable casting wheel or belt, or as a self-supporting sheet, which layer or sheet is then affixed to the surface of a suitable permanent support by means of a suitable adhesive, if necessary, or a solution or dispersion can be coated directly onto a suitable support. In those instances where the compositions are formable into self-supporting sheets or films such can serve as their own support.

Suitable base or support materials include metals, e.g., steel and aluminum plates, sheets and foils, and films or plates composed of various film-forming synthetic resins or high polymers, such as the addition polymers, and in particular vinylidene chloride copolymers with vinyl chloride, vinyl acetate, and acrylonitrile; vinyl chloride homopolymers and copolymers with vinyl acetate and acrylonitrile; linear condensation polymers such as polyesters, e.g., polyethylene terephthalate; polyamides, e.g., polyhexamethylenesebacamide; and polyesteramides, e.g., polyhexamethyleneadipamide adipate. Fillers or reinforcing agents can be present in the synthetic resin or polymer bases such as the various fibers (synthetic, modified, or natural); e.g., cellulosic fibers, for instance, cotton, cellulose acetate, viscose rayon, paper; glass wool; nylon and polyethylene terephthalate. These reinforced bases can be used in laminated form.

As previously indicated, an important aspect of the present invention comprises photopolymerizable elements suitable for the preparation of letterpress printing reliefs by the process described in U.S. Patent 2,760,863. The thickness of the photopolymerizable layer is a direct function of the thickness desired in the relief image and this will depend on the subject being reproduced and particularly on the extent of the non-printing areas. In the case of photopolymerized halftones, the screen used also is a factor. In general, the thickness of the polymerizable layer on the base plate will vary from 3 to 250 mils. Layers ranging from 3 to 60 mils in thickness will be used for the majority of the letterpress printing plates. Layers thicker than 50 to 60 mils can be used for the printing of designs and relatively large areas in letterpress printing plates. In general, the relief height-forming stratum of the photopolymerizable layer should be essentially non-light scattering.

In those instances where the photopolymerizable layers exhibit some surface tackiness, a transparent parting layer, such as a thin film of polystyrene, or other strippable material or of the known type of mold-release agents, for example, certain commercially available silicones and solutions of lecithin, can be used on the surface of the photopolymerizable layer when it is desired to protect for reuse an image-bearing negative or transparency superposed thereon.

Actinic light from any source and of any type can be used in these photopolymerization processes. The light can emanate from point sources or be in the form of parallel rays or divergent beams. By using a broad light source, relatively close to the image-bearing transparency, the light rays passing through the clear areas of the transparency enter as divergent beams and thus irradiate a continually diverging area in the photopolymerizable layer underneath the clear portions of the transparency, resulting in a polymeric relief having its greatest width at the bottom of the photopolymerized layer, i.e., a frustum, the top surface of the relief being the dimensions of the clear area. Inasmuch as the free-radical generating, addition polymerization initiators activatable by actinic light generally exhibit their maximum sensitivity in the ultraviolet range, the light source should furnish an effective amount of this radiation. Such sources include carbon arcs, mercury-vapor lamps, fluorescent lamps with special ultra-violet light-emitting phosphors, argon glow lamps, and photographic flood lamps. Of these, the mercury-vapor lamps, particularly the sun lamp type, and the fluorescent sun lamps, are most suitable.

The solvent liquid used for washing or "developing" the printing plates made from the photopolymerizable compositions of this invention should have good solvent action on the chain extended polyalkyleneether glycol polyurethane / polymerizable component / photoinitiator compositions and little action on the insolubilized image or upon the base material antihalation layer, or anchor layer, where any or all of the latter three are present, in the period required to remove the non-polymerized portions, In this development step where the relief is formed, the solvent can be applied in any convenient manner as by flowing, immersion, or spraying as by jets. Brushing likewise frequently aids in the removal of the unpolymerized portion of the composition. Development will generally, and most conveniently, be carried out at about room temperature, although higher temperatures, e.g., of the order of 30–100° C. or thereabouts, result in more rapid removal of the unpolymerized portion.

In addition to the materials specifically mentioned in the foregoing for possible utility in the solvent method of preparing the chain extended polyalkyleneether glycol/polyurethane products, or for the solution method of preparing the photopolymerizable elements of this invention, there can be mentioned other suitable solvents which are useful in forming either dispersed, free-flowing gels or solutions in concentrations of from 5 to 10% by weight of the photopolymerizable compositions. Such solvents include methyl ethyl ketone, toluene, nitrobenzene, o-dichlorobenzene, tetrachloroethane, chloroform, thiophene; 50–50 mixtures of tetrahydrofuran and methyl ethyl ketone, tetrahydrofuran and benzene; pyridine, cyclohexanone, the diethyl ether of ethylene glycol and dimethylformamide. Generally such solvents will preferably be handled in substantially anhydrous form.

Photopolymerizable elements suitable for making relief images can, as has been shown above, have on the photopolymerizable surface a protective removable or strippable layer and, if desired, also can have on the reverse surface of the support a pressure-sensitive adhesive layer provided with a protective strippable layer. Upon removal of the latter, the element can be pressed onto or otherwise adhered to a permanent support, e.g., a printing block or metal plate.

The printing reliefs made in accordance with this invention can be used in all classes of printing but are most applicable to those classes of printing wherein a distinct difference of height between printing and nonprinting areas is required. These classes include those wherein the ink is carried by the raised portion of the relief such as in dry-offset printing, ordinary letter press printing, the latter requiring greater height differences between printing and non-printing areas, and those wherein the ink is carried by the recessed portions of the relief such as in intaglio printing, e.g., line and inverted halftone. The plates are obviously useful for multicolor printing.

The photopolymerizable compositions of this invention are also suitable for other purposes in which readily insolubilized, solid, addition polymerizable compositions are useful, such as binders for television phosphors, in producing ornamental effects and plastic articles of various types, and the like. They are useful in making multicolor television screens by the photopolymerization procedures described in assignee's Swindells U.S. application Ser. No. 373,753, filed August 12, 1953.

This invention provides photopolymerizable elements for producing letterpress printing plates of uniform printing height from relatively inexpensive materials and with a marked reduction in labor requirements over the conventional photoengraving procedure. The images obtained show fidelity to the original transparency both in small details and in overall dimensions. The printing reliefs have the advantage that they have high impact strength and are not brittle but are tough and abrasion-resistant and have extraordinarily outsanding press wear. The reliefs are durable and dependable and have a somewhat resilient surface but do not become permanently deformed in normal use even though readily handleable and easily reformable from flat to curved or cylindrical form, or vice versa, depending on press conditions or demand.

What is claimed is:

1. A photopolymerizable element comprising a support and a solid layer comprising (1) 0.01% to 10% by weight of a free radical generating addition polymerization initiator activatable by actinic light and inactive thermally below 85° C., (2) 10% to 60% by weight of a normally non-gaseous ethylenically unsaturated addition polymerizable compound containing a plurality of terminal ethylenic groups having a molecular weight within the range from about 100 to about 1500, there being at least one such group for every 100–250 units of molecular weight, said compound having a boiling point of over 100° C. at normal pressure and being capable of forming a high polymer by photoinitiated addition polymerization in the presence of such an initiator, and (3) the balance of the percentage by weight of the three components being a linear polyalkyleneether-polyurethane polymer essentially composed of recurring structural units having the formula $$-\!\!\left[HN\!-\!\left(B\!-\!NH\!-\!\overset{O}{\overset{\|}{C}}\!-\!O\!-\!G\!-\!O\!-\!\overset{O}{\overset{\|}{C}}\!-\!NH\right)_n\!-\!B\!-\!NH\!-\!\left(Q\!-\!HN\!-\!B\!-\!NH\right)_m\right]\!\!-$$

where —O—G—O— is a bivalent radical inert to isocyanate groups resulting from removal of terminal hydrogen atoms from a polyoxyalkyleneether glycol having a molecular weight of at least 400; —B— is a bivalent organic radical; —Q— is a radical selected from the group consisting of a carbonyl radical and a non-polymeric diacyl radical; $n$ is an integer greater than 0 and $m$ is an integer including 0; each of the said structural units being connected by a radical —Q— having the significance defined above; the overall ratio of the number of —B— to —O—G—O radicals in the polymer being between 1.1:1 and 12:1 and at least 60% of the total weight of the polymer being the bivalent radicals —O—G—O.

2. An element as defined in claim 1 wherein said layer is 3 to 250 mils in thickness.

3. An element as defined in claim 1 wherein radical —B— is a 2,4-tolylene radical and radical —Q— is the non-polymeric radical $$-\overset{O}{\overset{\|}{C}}-NH-R-NH\overset{O}{\overset{\|}{C}}-$$

where R is a radical taken from the group consisting of alkylene and arylene.

4. An element as defined in claim 1 wherein said unsaturated compound is a diacrylate ester of a polyethylene glycol containing 2 to 3 oxyethylene groups.

5. An element as defined in claim 4 wherein said ester is triethylene glycol diacrylate.

6. A process for making a relief which comprises exposing to actinic light selected portions of a photopolymerizable element as set forth in claim 1 and removing the unexposed portions of said layer.

7. The process of making a printing relief which comprises exposing to actinic light through an image-bearing element having light-opaque areas of the same optical density and light-transparent areas which are of the same optical density a photopolymerizable element as set forth in claim 1 until the light-exposed areas are substantially polymerized to the insoluble state and removing unexposed portions of the layer from the element.

References Cited in the file of this patent

UNITED STATES PATENTS

| | | |
|---|---|---|
| 2,484,529 | Roedel | Oct. 11, 1949 |
| 2,760,863 | Plambeck | Aug. 28, 1956 |
| 2,808,391 | Pattison | Oct. 1, 1957 |

FOREIGN PATENTS

| | | |
|---|---|---|
| 167,675 | Australia | May 14, 1956 |
| 1,108,785 | France | Sept. 14, 1955 |
| 1,005,722 | Germany | Apr. 4, 1957 |